(12) United States Patent
Knopp et al.

(10) Patent No.: US 6,748,003 B1
(45) Date of Patent: Jun. 8, 2004

(54) INTRACAVITY SEMICONDUCTOR LENS FOR OPTOELECTRONIC DEVICES

(75) Inventors: Kevin J. Knopp, Amesbury, MA (US); Daryoosh Vakhshoori, Cambridge, MA (US)

(73) Assignee: Nortel Networks Limited (CA)

( * ) Notice: Subject to any disclaimer, the term of this patent is extended or adjusted under 35 U.S.C. 154(b) by 0 days.

(21) Appl. No.: 09/833,494

(22) Filed: Apr. 12, 2001

Related U.S. Application Data

(60) Provisional application No. 60/196,401, filed on Apr. 12, 2000.

(51) Int. Cl.[7] .................................................. H01S 5/00
(52) U.S. Cl. ........................................... 372/46; 372/45
(58) Field of Search ............................. 372/46, 45, 96, 372/102, 98, 101; 359/248

(56) References Cited

U.S. PATENT DOCUMENTS

| | | | | |
|---|---|---|---|---|
| 4,827,483 A | * | 5/1989 | Fukuzawa et al. | 372/45 |
| 4,965,806 A | * | 10/1990 | Ashby et al. | 372/45 |
| 5,307,200 A | * | 4/1994 | Yoshida | 359/248 |
| 5,822,356 A | * | 10/1998 | Jewell | 372/98 |

* cited by examiner

*Primary Examiner*—Quyen Leung
(74) *Attorney, Agent, or Firm*—Steubing McGuinnes & Manaras LLP

(57) ABSTRACT

A VCSEL having improved diffraction loss; comprising a series of deposited material layers comprising the structure of the VCSEL, and an intracavity lens formed in one of the series of deposited material layers. In one preferred form of the invention, the VCSEL comprises a bottom mirror mounted to the top of a substrate; a bottom spacer mounted to the top of the bottom mirror; a gain region mounted to the top of the bottom spacer; a top spacer mounted to the top of the gain region; and a top mirror mounted to the top of the top spacer, such that a reflective cavity is formed between the bottom mirror and the top mirror; with at least one of the bottom mirror, bottom spacer, gain region, top spacer and top mirror containing a superlattice structure, and with an adjacent region being subjected to ion implantation and rapid thermal annealing so as to disorder the superlattice structure and change its index of refraction, whereby to create an intracavity lens so as to reduce diffraction loss.

10 Claims, 13 Drawing Sheets

INTRACAVITY SEMICONDUCTOR LENS FOR OPTOELECTRONIC DEVICES

REFERENCE TO PENDING PRIOR PATENT APPLICATION

This patent application claims benefit of pending prior U.S. Provisional Patent Application Serial No. 60/196,401, filed Apr. 12, 2000 by Kevin J. Knopp et al. for INTRACAVITY SEMICONDUCTOR LENS FOR OPTOELECTRONIC DEVICES which patent application is hereby incorporated herein by reference.

FIELD OF THE INVENTION

This invention relates to optical devices in general, and more particularly to optoelectronic devices.

BACKGROUND OF THE INVENTION

Optoelectronic devices are electronic devices for emitting, modulating, transmitting and sensing light.

One important type of optoelectronic device is the vertical cavity surface emitting laser (VCSEL). VCSEL's have recently generated considerable interest in the art. One reason for this interest is because VCSEL's are believed to have application in a wide range of different optical telecommunication systems, e.g., wavelength division multiplexing (WDM) fiberoptic systems, switches, routers, etc.

A VCSEL generally comprises a substrate, a bottom mirror deposited on the top of the substrate, a bottom spacer deposited on the top of the bottom mirror, a gain region deposited on the top of the bottom spacer, a top spacer deposited on the top of the gain region, and a top mirror deposited on the top of the top spacer, such that a reflective cavity is formed between the bottom mirror and the top mirror, with the gain region being disposed within the reflective cavity. The gain region is constructed so that when the gain region is appropriately stimulated, e.g., by optical pumping, the gain region will emit light. The bottom mirror is typically substantially fully reflective at the wavelengths of interest, and the top mirror is typically partially reflective at the wavelengths of interest, so as to allow the laser light to build up within the reflective cavity before being emitted from the top end of the laser. It has been found that the laser light can become dissipated as it is reflected back and forth across the reflective cavity. Unfortunately, such dissipation reduces the efficiency of the laser. Thus, it would be advantageous if a lens could be provided within the reflective cavity so as to minimize light loss due to diffraction and to increase cavity stability.

SUMMARY OF THE INVENTION

Accordingly, an object of the present invention is to provide an improved VCSEL.

In one form of the invention, there is provided a VCSEL having improved diffraction loss, comprising a series of deposited material layers comprising the structure of the VCSEL, and an intracavity lens formed in one of the series of the deposited material layers.

In another form of the invention, there is provided a VCSEL which comprises a substrate, a bottom mirror deposited on the top of the substrate, a bottom spacer deposited on the top of the bottom mirror, a gain region deposited on the top of the bottom spacer, a top spacer deposited on the top of the gain region, and a top mirror deposited on the top of the top spacer, such that a reflective cavity is formed between the bottom mirror and the top mirror, with at least one of the bottom mirror, bottom spacer, gain region, top spacer and top mirror containing a superlattice structure, and with an adjacent region being subjected to ion implantation and rapid thermal annealing so as to disorder the superlattice structure and change its index of refraction, whereby to create an intracavity lens so as to reduce diffraction loss and to increase cavity stability.

BRIEF DESCRIPTION OF THE DRAWINGS

These and other objects and features of the present invention will be more fully disclosed by the following detailed description of the preferred embodiments of the invention, which is to be considered together with the accompanying drawings wherein like numbers refer to like parts and further wherein:

FIGS. 2–8 are schematic views illustrating fabrication of the novel VCSEL of FIG. 1, wherein FIG. 2 shows a bottom mirror mounted to the top of a substrate, FIG. 3 shows a bottom spacer mounted to the top of the bottom mirror, FIG. 4 shows a gain region mounted to the top of the bottom spacer, FIG. 5 shows a top spacer mounted to the top of the gain region, FIG. 6 shows a top mirror mounted to the top of the top spacer, FIG. 7 shows a masking layer mounted to the top of the top mirror, FIG. 8 shows the masking layer having been removed from the top of the top mirror and replaced by a proximity cap.

DETAILED DESCRIPTION OF THE PREFERRED EMBODIMENTS

Figure 1:
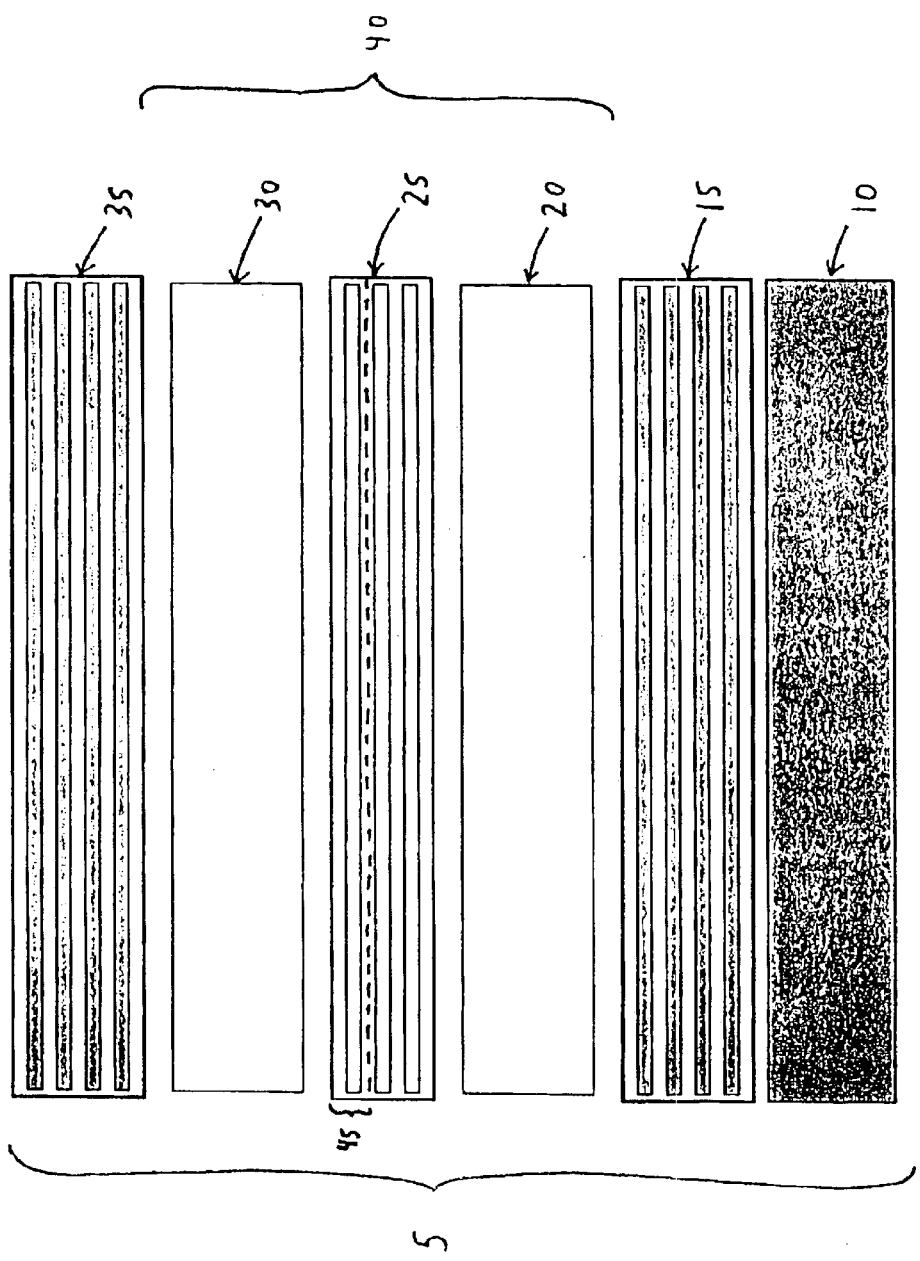
FIG. 1 is a schematic sectional view of a novel VCSEL formed in accordance with the present invention.

Referring to FIG. 1, there is shown a VCSEL 5 formed in accordance with the present invention. VCSEL 5 generally comprises a substrate 10, a bottom mirror 15 deposited on the top of substrate 10, a bottom spacer 20 deposited on the top of bottom mirror 15, a gain region 25 deposited on the top of bottom spacer 20, a top spacer 30 deposited on the top of gain region 25, and a top mirror 35 deposited on the top of top spacer 30, with a reflective cavity 40 being formed between bottom mirror 15 and top mirror 35. Gain region 25 is constructed so that when the gain region is appropriately stimulated, e.g., by optical pumping, the gain region will emit light. Bottom mirror 15 is substantially fully reflective at the wavelengths of interest, and top mirror 35 is partially reflective at the wavelengths of interest, so as to allow the laser light to build up within reflective cavity 40 before being emitted from the top end of the laser.

In accordance with the present invention, at least one of the bottom mirror 15, bottom spacer 20, gain region 25, top spacer 30 and top mirror 35 contains a superlattice structure, and an adjacent region is subjected to ion implantation and rapid thermal annealing so as to disorder the superlattice structure and change its index of refraction, whereby to create an intracavity lens 45 so as to reduce diffraction loss within the laser and increase cavity stability.

In accordance with the present invention, VCSEL 5 may be formed as follows.

Figure 2:
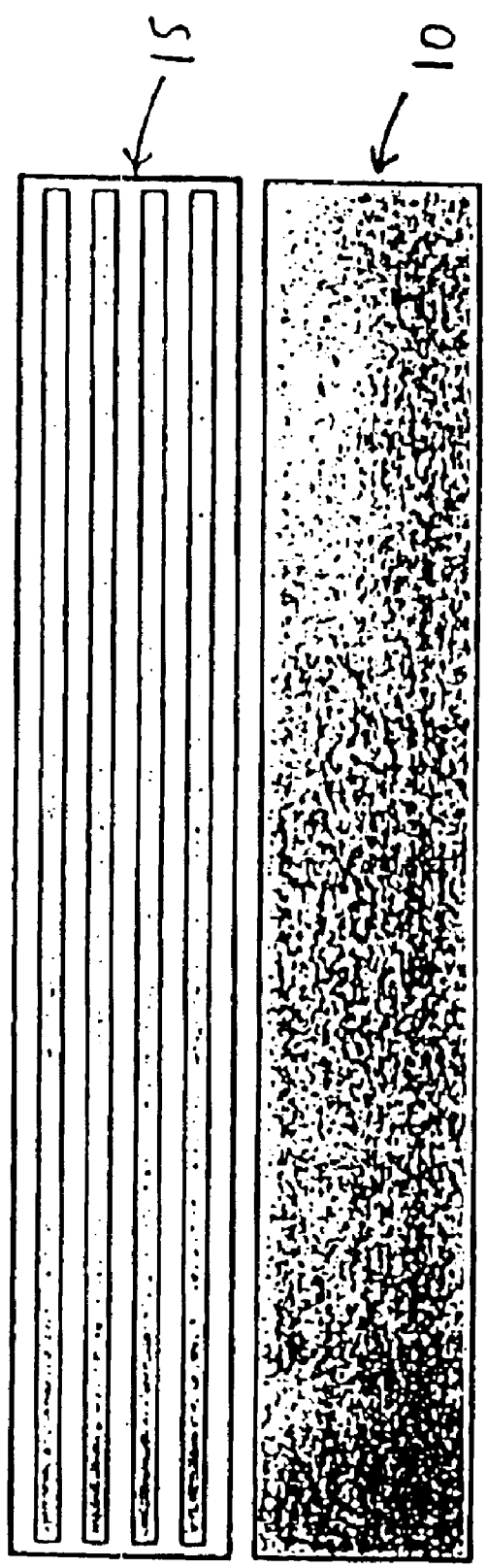
Figure 3:
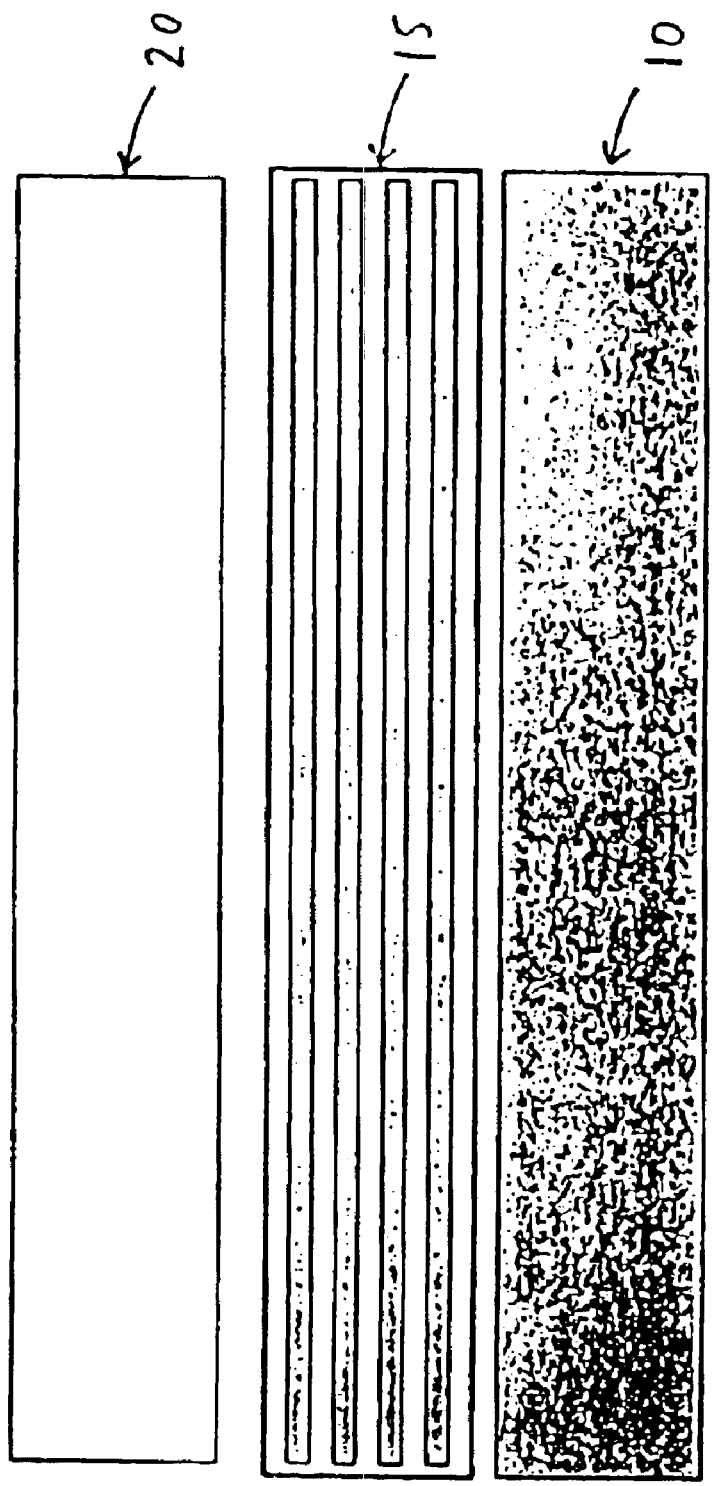

A bottom mirror 15 is deposited on the top of substrate 10 (FIG. 2), and then a bottom spacer 20 (FIG. 3) is deposited on the top of bottom mirror 15. Substrate 10 preferably comprises a semiconductor material such as Si, GaAs, InP or other suitable materials. Bottom mirror 15 may be formed out of a semiconductor material such as Si, GaAs, InP, AlGaAs, InGaAsP, InAlGaAs, InAlAs, AlGaAsSb or AlAsSb, or other suitable materials. Bottom mirror 15 may be deposited on substrate 10 by any suitable thin film deposition techniques. Bottom spacer 20 preferably comprises a semiconductor material such as InP, GaAs, AlGaAs, InGaAsP, InAlGaAs, InAlAs, AlGaAsSb or AlAsSb, and may be grown on bottom mirror 15 by MOCVD (metal organic chemical vapor deposition) or MBE (molecular beam epitaxy).

Figure 4:
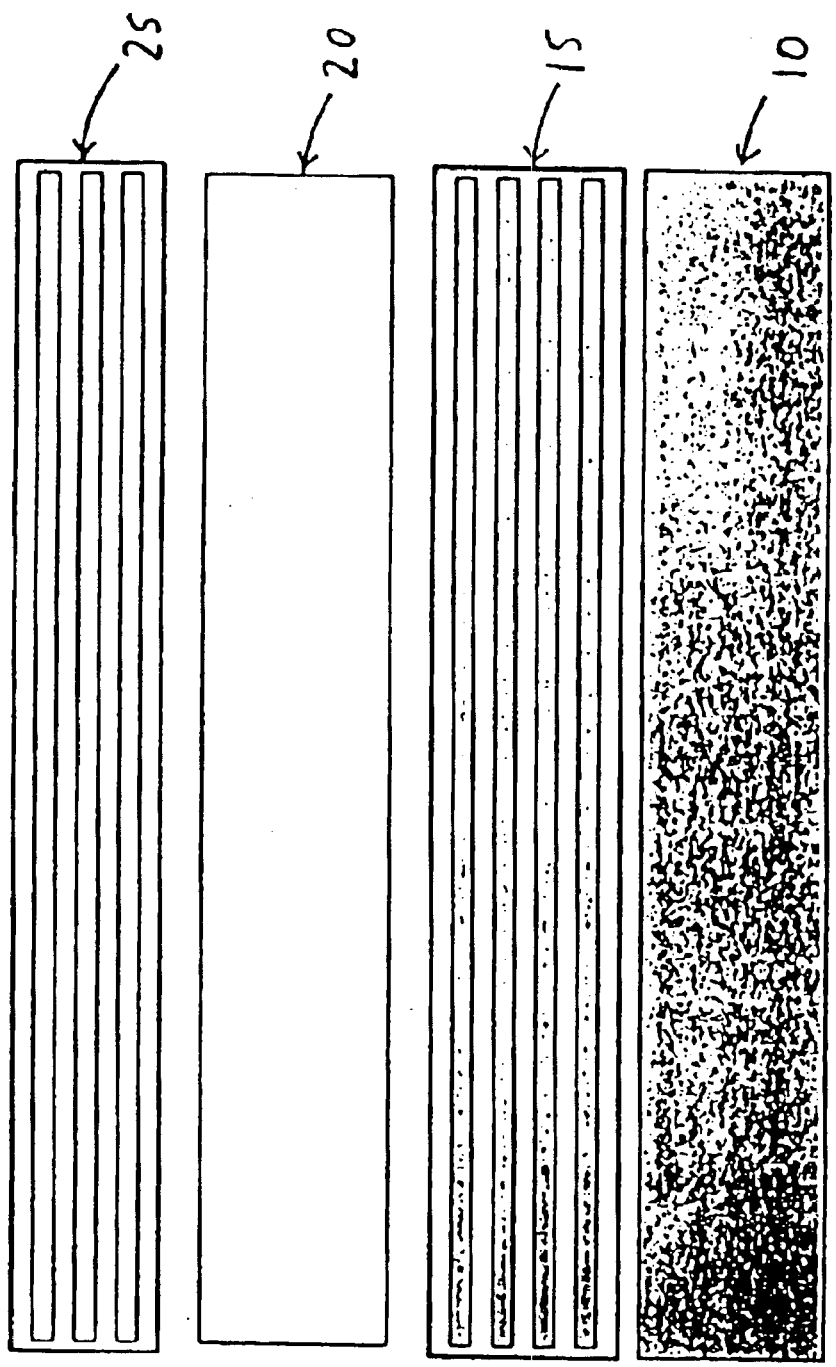

Next, gain region 25 (FIG. 4) is deposited on top of bottom spacer 20. Gain region 25 may comprise an InGaAsP, InGaAs, GaAs, AlGaAs, InGaAsP, InAlGaAs, InAlAs, InAlAs, AlGaAsSb or AlAsSb multiple quantum well (MQW) structure. Gain region 25 may be deposited on bottom spacer 20 by MBE (molecular beam epitaxy) or MOCVD (metal organic chemical vapor disposition) methods. Gain region 25 is formed such that lasing can be achieved within reflective cavity 40 by photo-pumping with a separate pump laser having a wavelength that is highly absorptive within the gain spectrum of the gain medium used in gain region 25.

Figure 5:
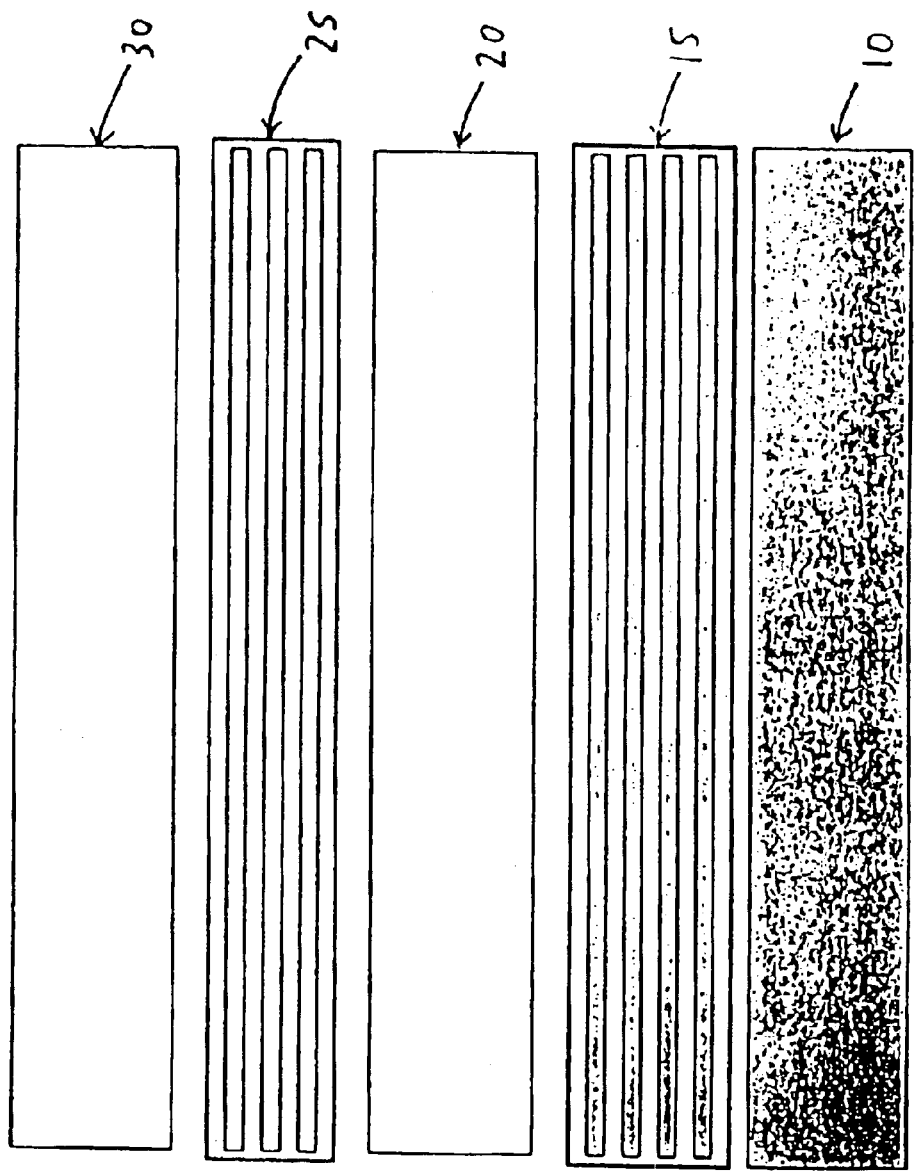

Top spacer 30 (FIG. 5) is then deposited on gain region 25. Top spacer 30 preferably comprises a semiconductor material such as InP, GaAs, AlGaAs, InGaAsP, InAlGaAs, InAlAs, AlGaAsSb or AlAsSb, and may be deposited on gain region 25 by MBE or MOCVD or other thin film coating techniques.

Figure 6:
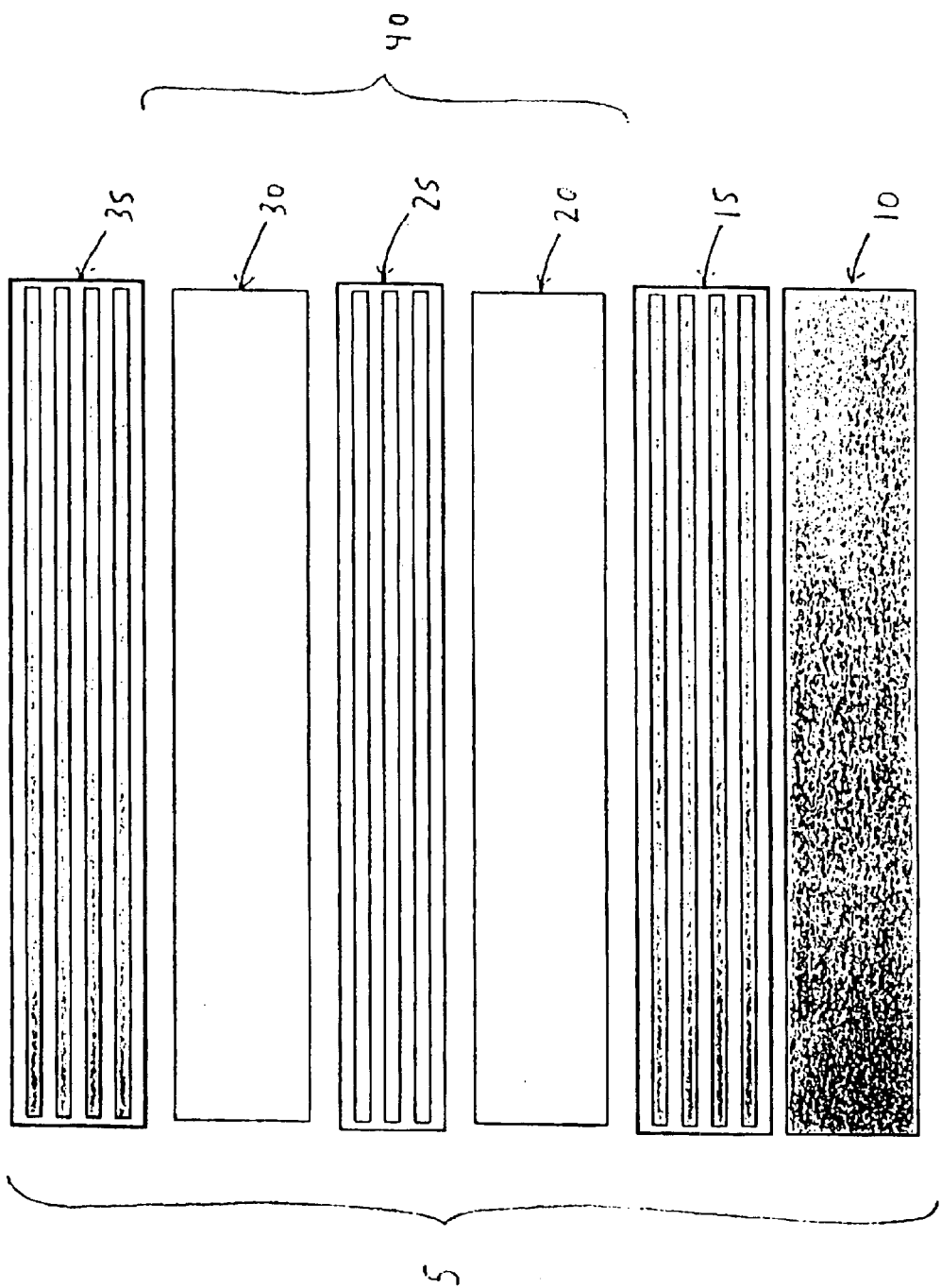

Next, top mirror 35 (FIG. 6) is deposited on top spacer 30. In one preferred form of the invention, top mirror 35 comprises a semiconductor material such as Si, GaAs, InP, GaAs, AlGaAs, InGaAsP, InAlGaAs, InAlAs, AlGaAsSb or AlAsSb, or other suitable materials. Top mirror 35 may be deposited on top spacer 30 by thin film coating technology.

In accordance with the present invention, at least one of bottom mirror 15, bottom spacer 20, gain region 25, top spacer 30 and top mirror 35 contains a superlattice structure, and an adjacent region is subjected to ion implantation and rapid thermal annealing so as to disorder the superlattice structure and change its index of refraction in a spatially-varying manner, whereby to create an intracavity lens 45 so as to reduce diffraction loss.

Figure 7:
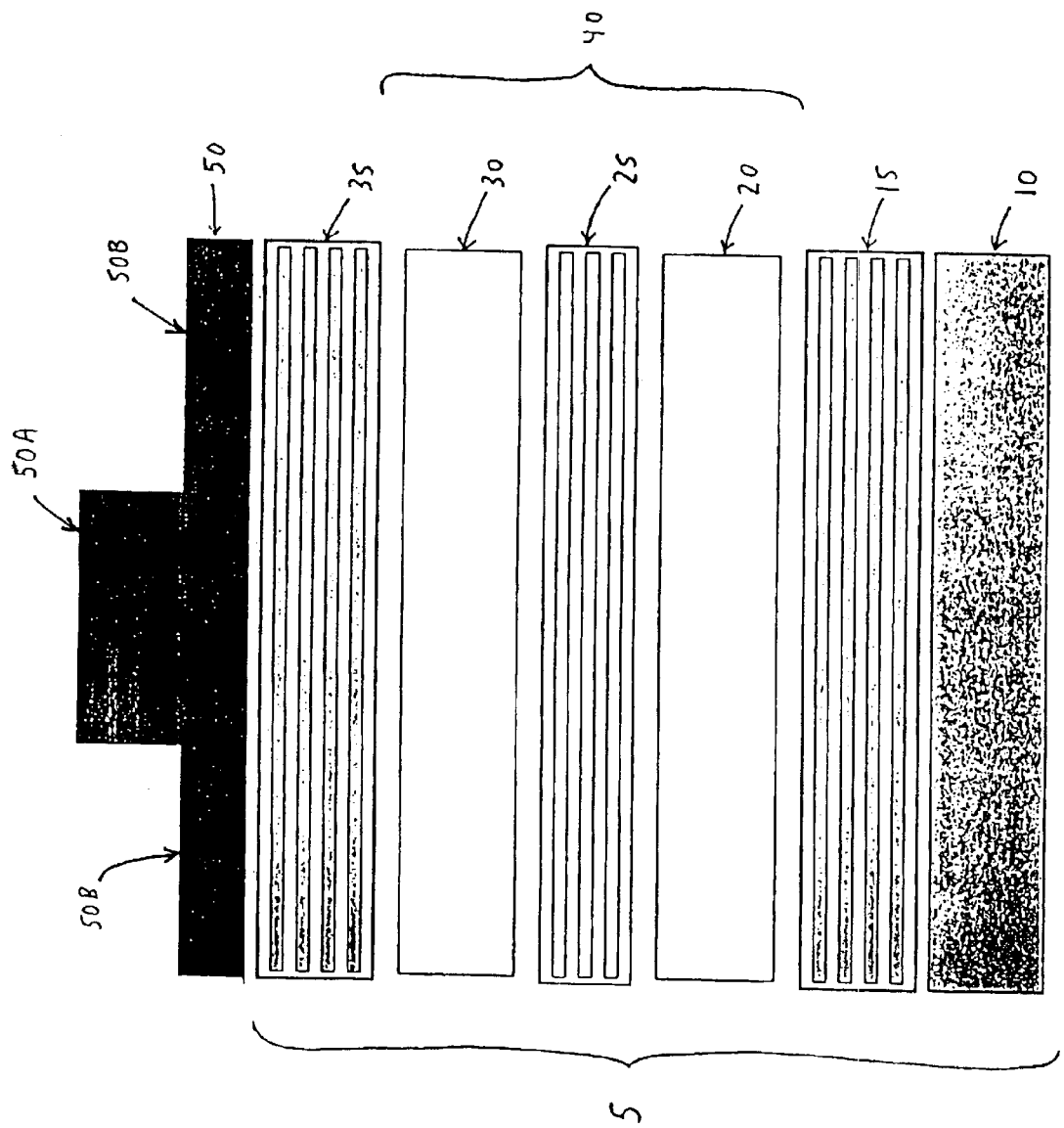

More particularly, in one preferred form of the invention, after mirror 35 has been deposited on top spacer 30, a dielectric masking layer 50 (FIG. 7) is deposited on top of top mirror 35. Masking layer 50 preferably comprises a dielectric material such as silicon nitride, silicon dioxide, etc., and may be deposited by thin film deposition techniques. Masking layer 50 has a non-uniform thickness such that subsequent ion bombardment can create a spatially-varying index of refraction in at least one of the underlying layers of the VCSEL. More particularly, the cross-sectional profile of masking layer 50 governs the spatially-varying degree of ion implantation, which in then governs the spatially-varying index of refraction of the lens formed in the VCSEL. Thus, for example, in FIG. 7 masking layer 50 is shown with a thicker center 50A and a thinner periphery 50B, whereby to yield a lower concentration of ion implantation toward the center of the device. Masking layer 50 typically has a thickness of approximately 1–5 microns.

Once masking layer 50 has been applied to top mirror 35, the VCSEL is bombarded with ions so as to create crystalline damage and point defects in at least one of bottom mirror 15, bottom spacer 20, gain region 25, top spacer 30 and top mirror 35. Rapid thermal annealing (see below) then induces disorder in an adjacent superlattice structure, whereby to change its index of refraction and create an intracavity lens. Ions such as phosphorus, oxygen, helium and indium may be used, with a "dosage" of about $3-30 \times 10^{13}$ ions/cm$^2$ and an energy level of about 100–500 KeV. The particular ion selected, and the particular "dosages" and energy levels utilized, regulate the "damage profile" created in the underlying layers of the VCSEL, i.e., the disorder created in a superlattice structure of the laser. In one preferred form of the present invention, masking layer 50 and the ion bombardment particulars are chosen so as to create the desired disorder in the superlattice structure of the gain region's multiple quantum wells.

Figure 8:
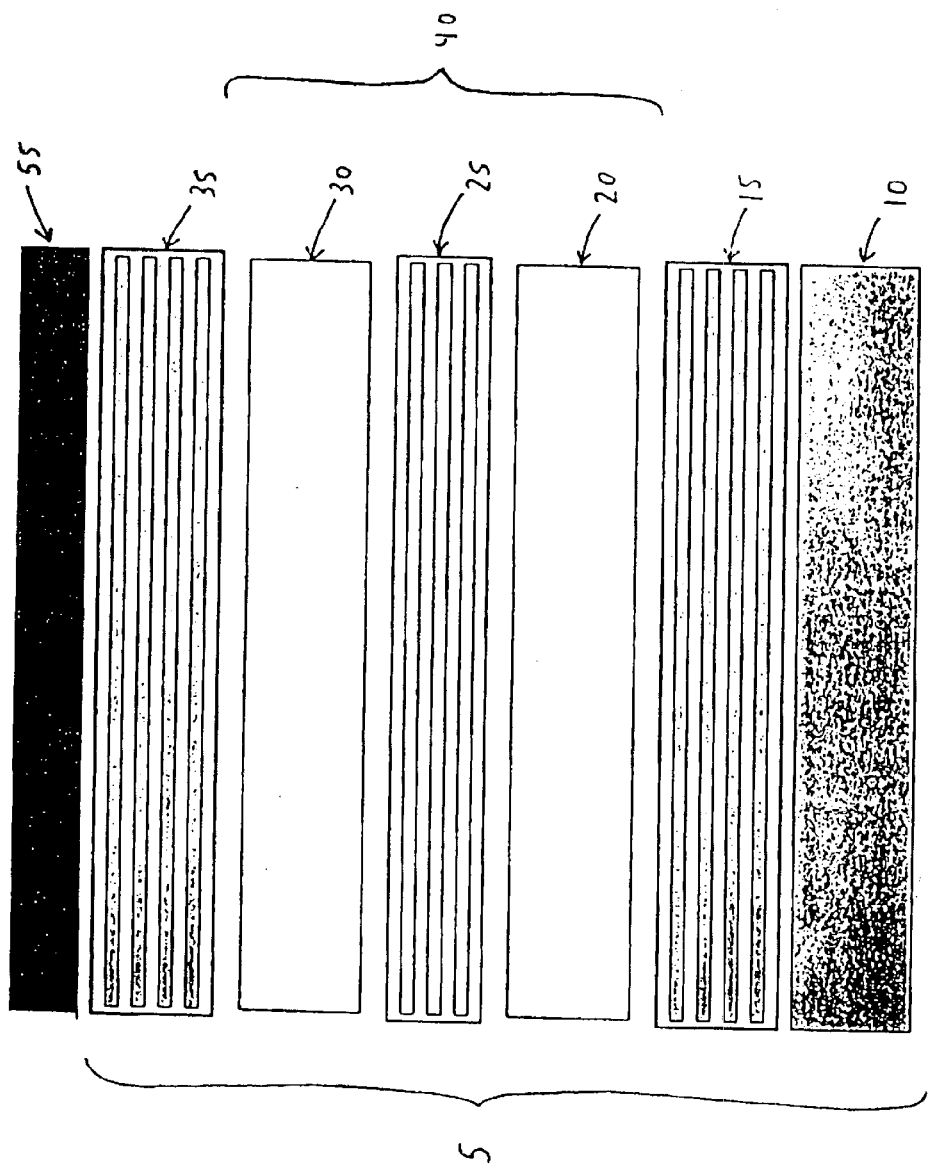

Once the desired crystalline damage and point defects have been created in at least one of bottom mirror 15, bottom spacer 20, gain region 25, top spacer 30 and top mirror 35, masking layer 50 is removed, e.g., by wet or dry chemical etching. Then a proximity cap 55 (FIG. 8) is placed on the top surface of top mirror 35. Proximity cap 55 is preferably formed out a semiconductor material such as Si, Gas, InP or other suitable material. In one preferred form of the invention, proximity cap 55 is formed out of the same material as substrate 10.

Figure 9:
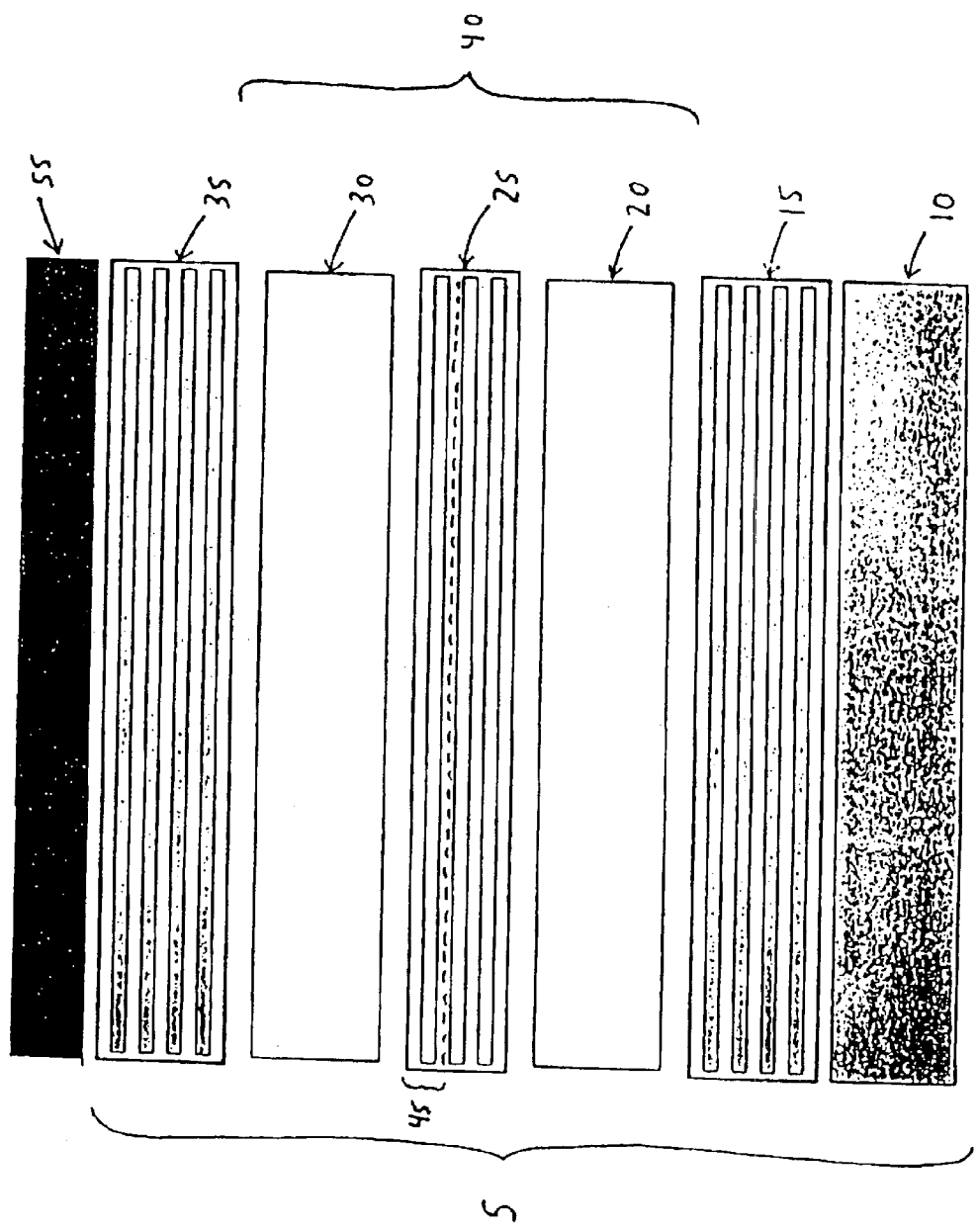
FIG. 9 shows the structure of FIG. 8 after annealing so as to create the intracavity lens.
Figure 10:
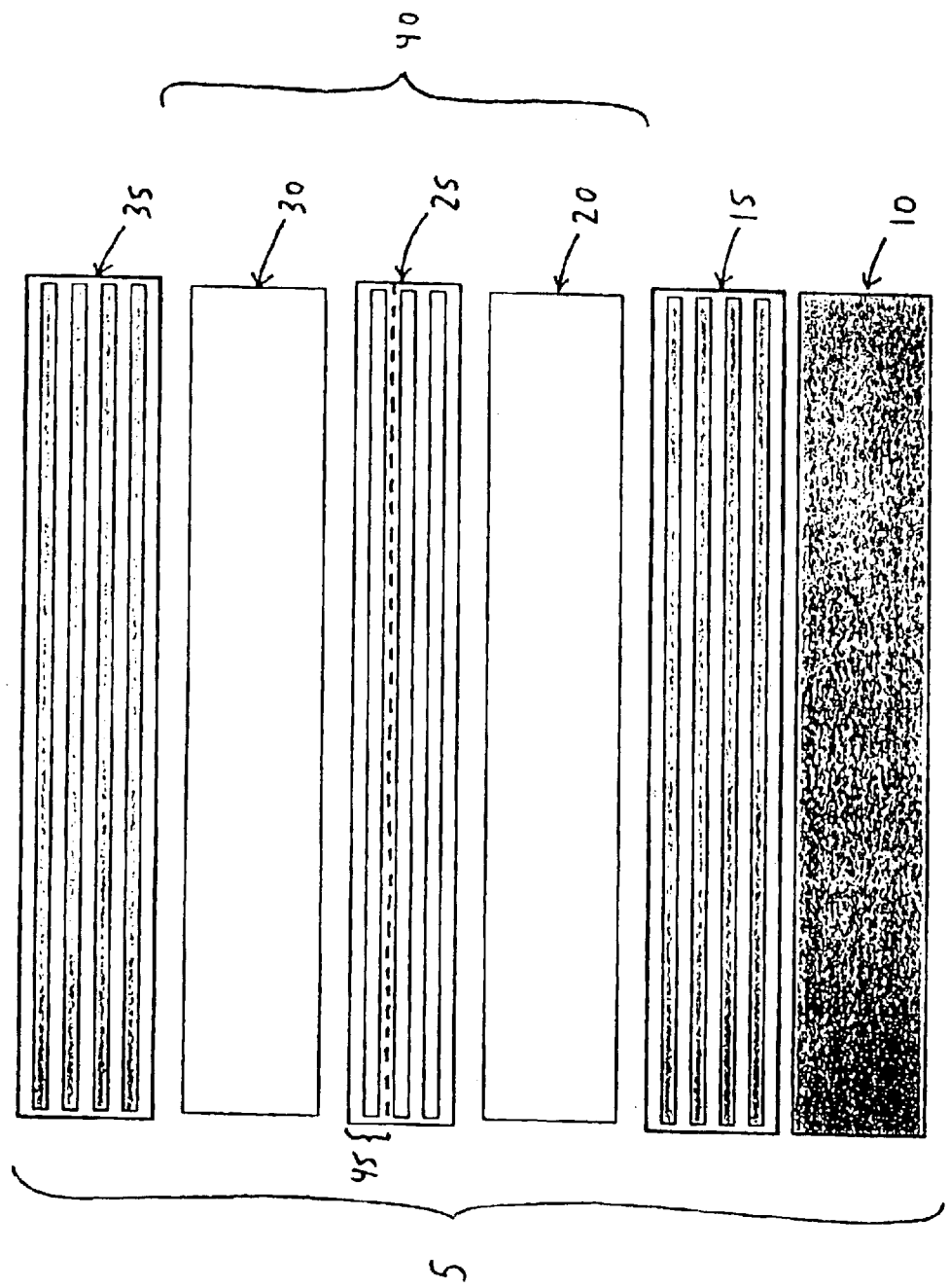
FIG. 10 shows the completed VCSEL after removal of the proximity cap.

After proximity cap 55 has been placed on top of top mirror 35, the device is annealed, e.g., for 1–5 minutes at a temperature of about 500–650° C. This causes the crystalline damage and point defects in upper spacer 30 to create the desired disorder in the superlattice structure of the gain region's multiple quantum wells. Inasmuch as this disorder is spatially-varying, it will create a spatially-varying change in the index of refraction of gain region 25, whereby to create a semiconductor lens 45 (FIG. 9) in gain region 25. This semiconductor lens will reduce diffraction loss within the VCSEL. Once semiconductor lens 45 has been established in the laser, proximity cap 55 is removed, e.g., by lifting. Accordingly, the VCSEL 5 is formed, according to the present invention, having an intracavity semiconductor lens 45 to reduce diffraction loss.

Figure 11:
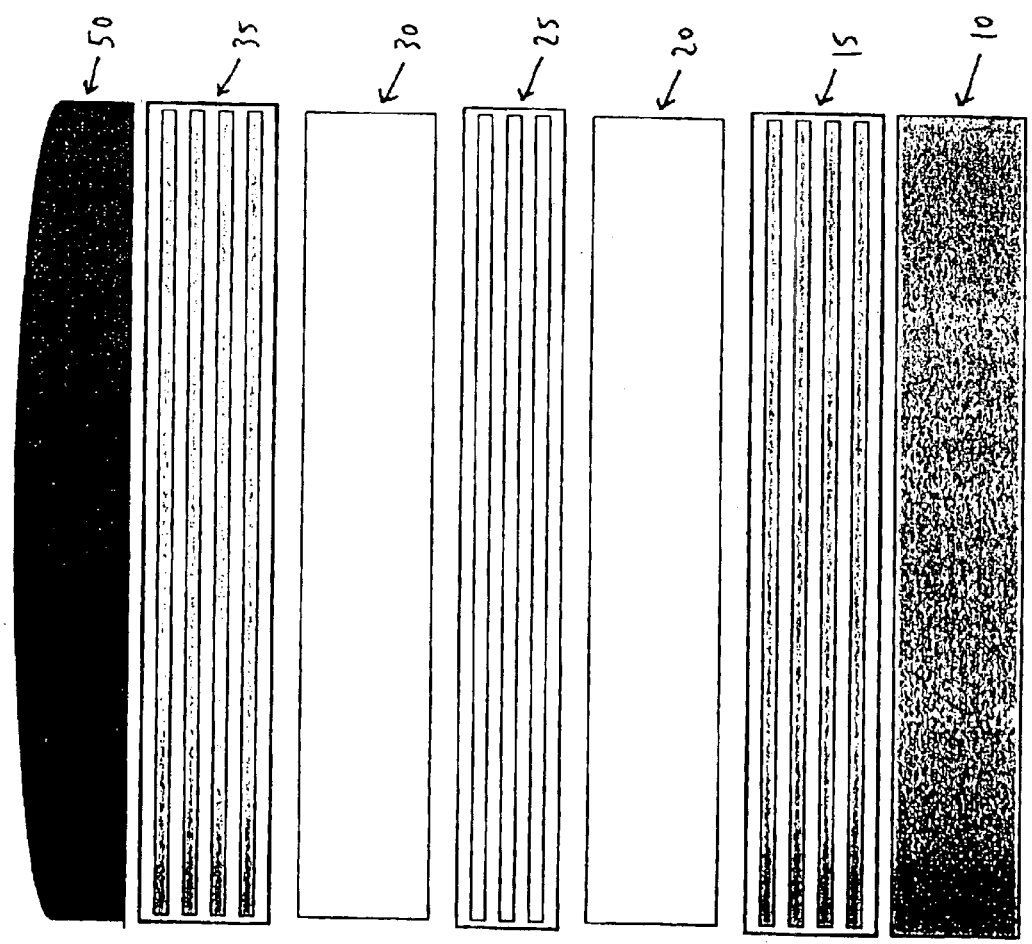
FIG. 11 is a schematic sectional view like that of FIG. 7, but showing an alternative form of masking layer.
Figure 12:
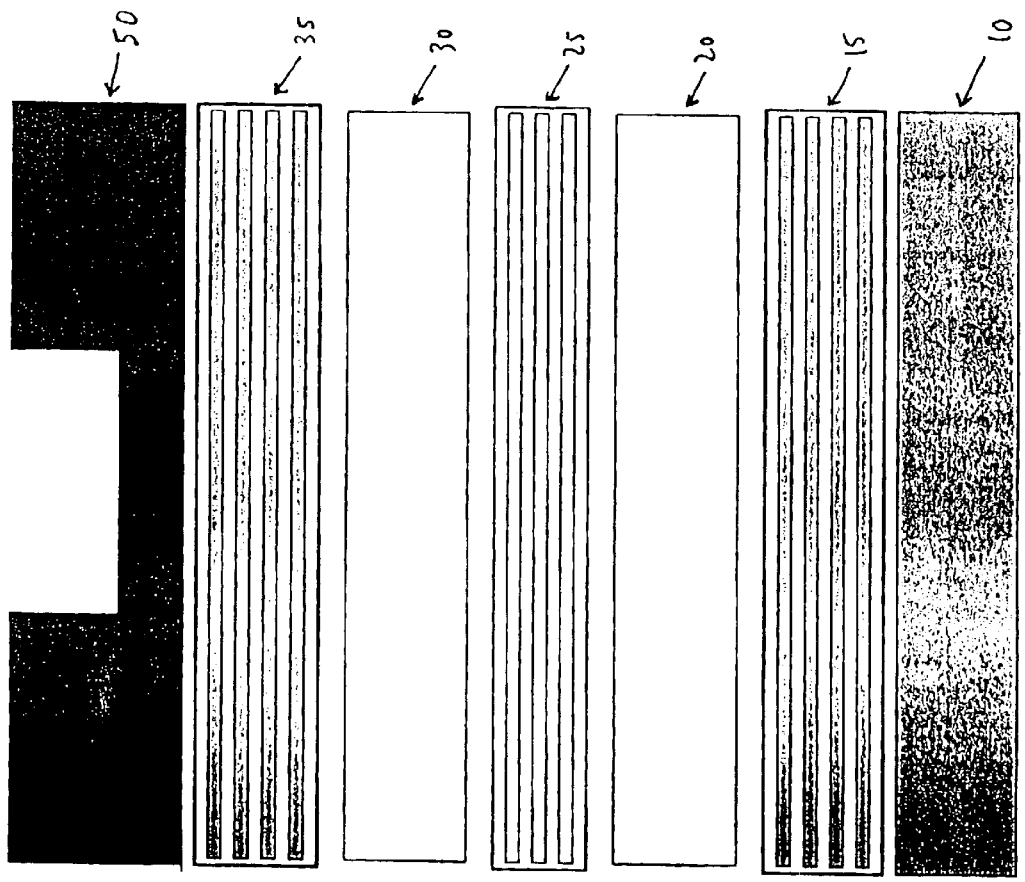
FIG. 12 is a schematic sectional view like that of FIG. 7, but showing another alternative form of masking layer.
Figure 13:
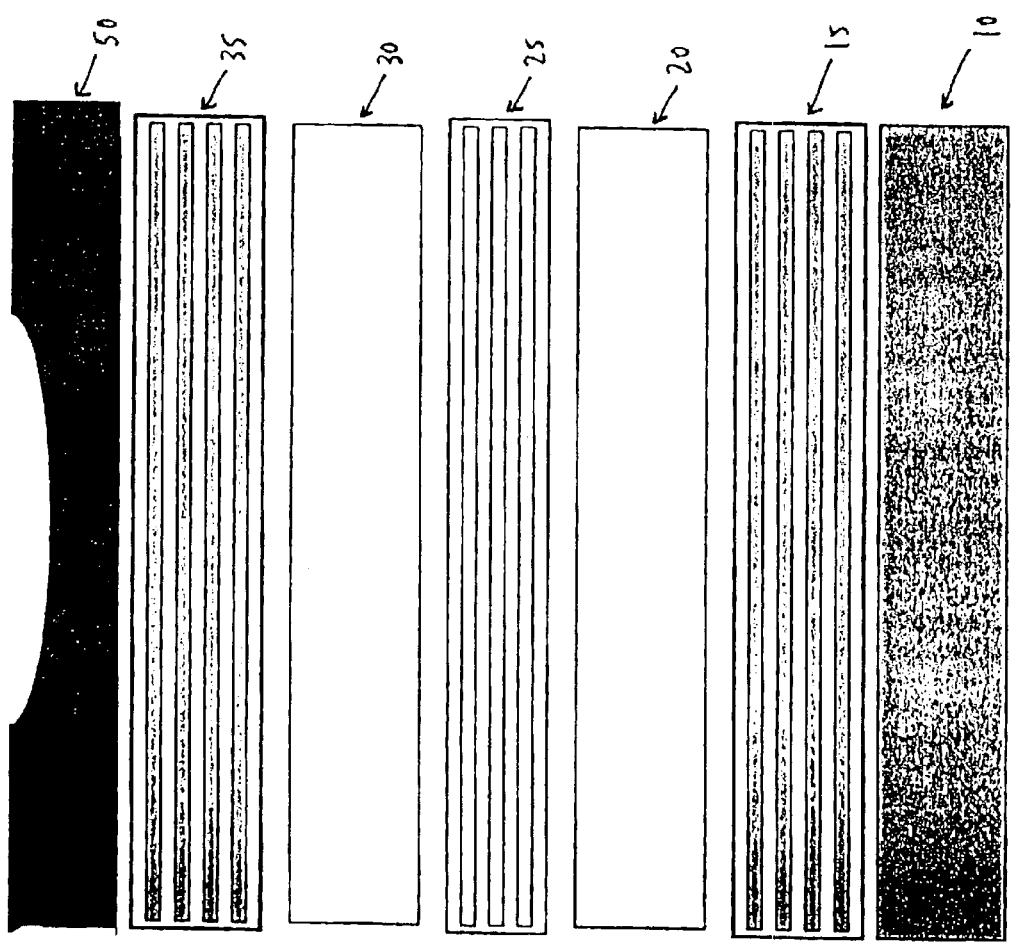
FIG. 13 is a schematic sectional view like that of FIG. 7, but showing still another alternative form of masking layer.

As noted above, the cross-sectional profile of masking layer 50 governs the spatially-varying index of refraction of the intracavity lens 45 formed in the VCSEL. In this respect it will be appreciated that the masking layer 50 may have a cross-sectional profile different than that shown in FIG. 7, as dictated by the desired spatially-varying index of the refraction. By way of example but not limitation, in FIG. 11 there is shown a masking layer 50 having a rounded convex upper surface, in FIG. 12 there is shown a masking layer 50 having a stepped upper surface, and in FIG. 13 there is shown a masking layer 50 having a rounded concave upper surface. Still other surface profiles will be apparent to those skilled in the art.

In the foregoing description of the preferred embodiment of the invention, the intracavity semiconductor lens 45 was described as being formed in gain region 25. However, as noted elsewhere in this application, the intracavity semiconductor lens 45 may also be formed in any one (or more) of bottom mirror 15, bottom spacer 20, top spacer 30 and top mirror 35, so long as they have a superlattice structure, such that an adjacent region can be subjected to ion implantation and subsequent thermal annealing will disorder the superlattice structure and change its index of refraction, whereby to create an intracavity lens to reduce diffraction loss within the laser.

In addition, in the foregoing description of the preferred embodiment of the invention, the VCSEL's reflective cavity 40 was formed before the ion implantation and annealing used to form intracavity lens 45. However, if desired, ion implantation and annealing can be carried out after formation of the VCSEL regions needed to form the intracavity semiconductor lens, i.e., prior to formation of the complete reflective cavity 40.

Also, it should be appreciated that bottom mirror 15 and/or top mirror 35 may be a Distributed Bragg Reflector (DBR) formed out of alternating layers of quarter-wavelength thick deposited dialectic films, e.g., silicon (Si) and aluminum oxide ($Al_2O_3$), or silicon (Si) and silicon dioxide ($SiO_2$), or silicon (Si) and magnesium oxide (MgO), or $TiO_2$ and $SiO_2$, or $Ta_2O_5$ or zirconium oxide, etc.

It will be understood that the foregoing detailed description of the preferred embodiments of the invention has been presented by way of illustration and not limitation. Various modifications, variations, changes, adaptations and the like will occur to those skilled in the art in view of the foregoing specification. Accordingly, the present invention should be understood as being limited only by the terms of the claims.

What is claimed is:

1. A VCSEL having improved diffraction loss, comprising:
   a series of deposited material layers comprising the structure of said VCSEL, the series of deposited material layers comprising:
      a bottom mirror deposited on the top of a substrate;
      a bottom spacer deposited on the top of said bottom mirror;
      a gain region deposited on the top of said bottom spacer;
      a top spacer deposited on the top of said gain region; and
      the top mirror deposited on the top of said top spacer, such that a reflective cavity is formed between said bottom mirror and said top mirror; and
      an intracavity lens formed in said gain region, and intracavity lens extending across at least a central portion of said gain region.

2. A VCSEL according to claim 1 wherein said gain region comprises a superlattice structure, with an adjacent region being subjected to ion implantation and rapid thermal annealing so as to disorder the superlattice structure and change its index of refraction, whereby to create said intracavity lens.

3. A VCSEL according to claim 1 wherein said substrate comprises a semiconductor material.

4. A VCSEL according to claim 1 wherein said bottom mirror and said top mirror comprise a semiconductor material.

5. A VCSEL according to claim 4 wherein said semiconductor material is chosen from the group consisting of Si, GaAs and InP.

6. A VCSEL according to claim 1 wherein said bottom spacer and said top spacer comprise a semiconductor material.

7. A VCSEL according to claim 6 wherein said bottom spacer and said top spacer comprise InP.

8. A VCSEL according to claim 1 wherein said gain region comprises a multiple quantum well structure.

9. A VCSEL according to claim 8 wherein said gain region comprises a material chosen from the group consisting of InGaAsP and InGaAs.

10. A VCSEL according to claim 8 wherein said ion implantation uses ions selected from the group consisting of phosphorus, oxygen, helium and indium.

* * * * *